United States Patent
Chang et al.

(10) Patent No.: US 8,547,755 B2
(45) Date of Patent: *Oct. 1, 2013

(54) METHOD AND APPARATUS OF PERFORMING AN ERASE OPERATION ON A MEMORY INTEGRATED CIRCUIT

(71) Applicants: Yi-Fan Chang, Pingjhen (TW); Cheng Ming Yih, Hsinchu (TW); Su-chueh Lo, Hsinchu (TW); Jian Shing Liu, Zhubei (TW); Kuen Long Chang, Taipei (TW); Chun-Hsiung Hung, Hsinchu (TW)

(72) Inventors: Yi-Fan Chang, Pingjhen (TW); Cheng Ming Yih, Hsinchu (TW); Su-chueh Lo, Hsinchu (TW); Jian Shing Liu, Zhubei (TW); Kuen Long Chang, Taipei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/708,102

(22) Filed: Dec. 7, 2012

(65) Prior Publication Data

US 2013/0100745 A1     Apr. 25, 2013

Related U.S. Application Data

(63) Continuation of application No. 12/834,686, filed on Jul. 12, 2010, now Pat. No. 8,339,861.

(30) Foreign Application Priority Data

Nov. 27, 2009 (TW) .............................. 98140673 A

(51) Int. Cl.
*G11C 16/04* (2006.01)
*G11C 16/06* (2006.01)

(52) U.S. Cl.
USPC ............. 365/185.33; 365/185.02; 365/185.11; 365/185.13; 365/185.29

(58) Field of Classification Search
USPC ...................................... 365/185.33
See application file for complete search history.

(56) References Cited

U.S. PATENT DOCUMENTS 8,339,861 B2 * 12/2012 Chang et al. ............. 365/185.22

* cited by examiner

*Primary Examiner* — Son Mai
(74) *Attorney, Agent, or Firm* — Kenta Suzue; Haynes Beffel & Wolfeld LLP

(57) ABSTRACT

Various discussed approaches include an improved grouping of edge word lines and center word lines of an erase group during erase verify and erase sub-operations of an erase operation. In another approach, changed voltage levels of edge word lines to address the over-erase issue of the erase group, and also improve erase time performance. Another approach uses dummy word lines.

16 Claims, 12 Drawing Sheets

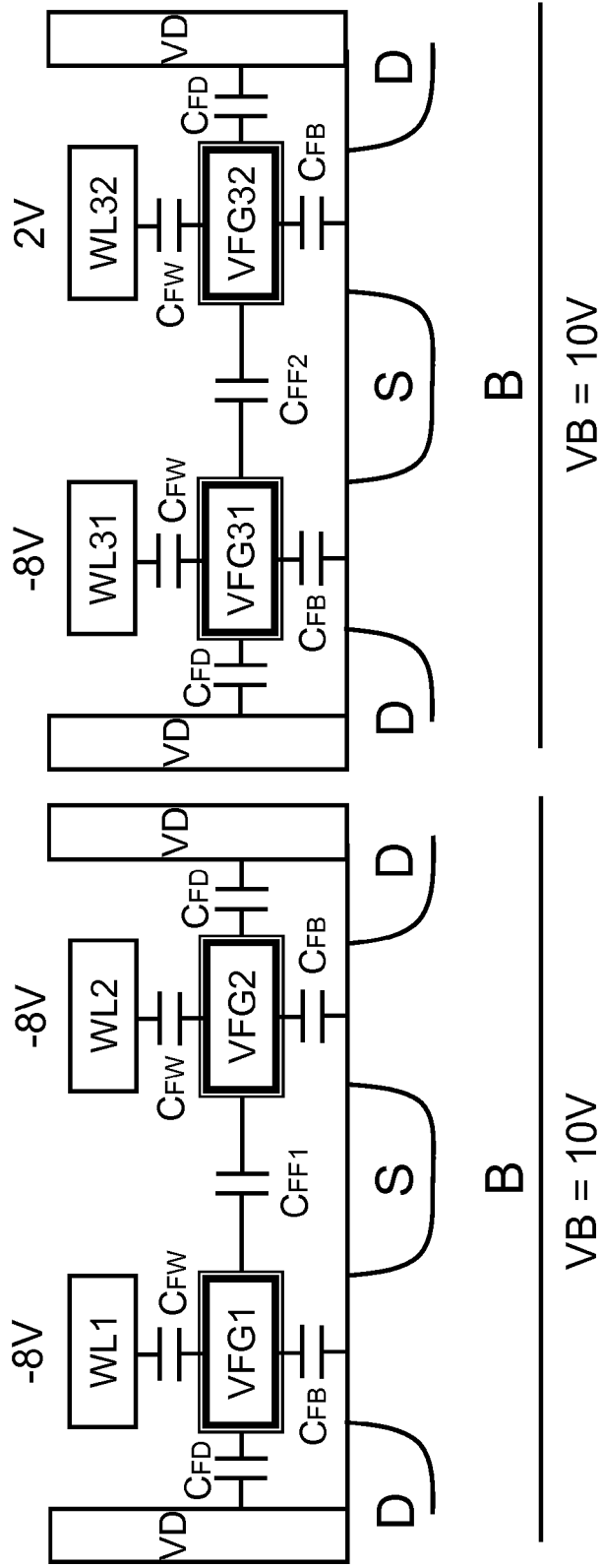

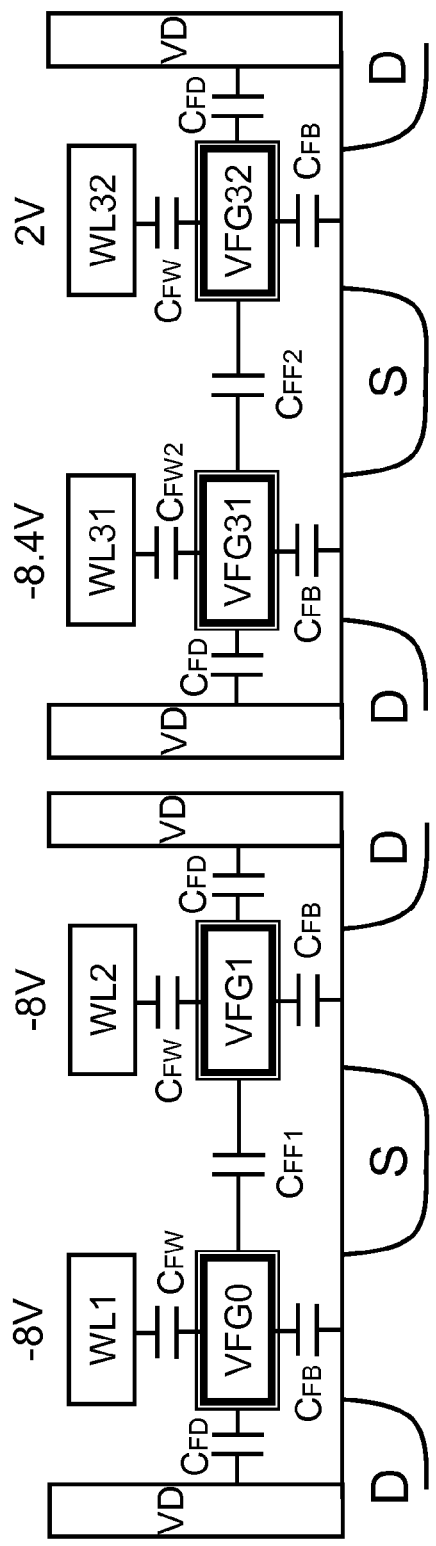

METHOD AND APPARATUS OF PERFORMING AN ERASE OPERATION ON A MEMORY INTEGRATED CIRCUIT

RELATED APPLICATIONS

This application is a continuation of U.S. patent application Ser. No. 12/834,686, filed on 12 Jul. 2010, which claims priority under 35 U.S.C. 119 to Taiwanese Application No. 098140673, filed 27 Nov. 2009. These applications are incorporated herein by reference.

BACKGROUND

1. Field of the Invention

The technology relates to memory integrated circuits, in particular the erase operation of a nonvolatile memory integrated circuit.

2. Description of Related Art

Improvement of the over-erase effect from the erase operation has become an increasingly serious problem. Because of higher and higher memory array density, the floating gate coupling effect becomes even more serious.

However, present approaches of the erase operation of nonvolatile memory cells are inefficient. For example, in the erase operation of FIGS. 1-5 over-erased memory cells can result. In another example, such as US Patent Application Publication 2008/0175069, erase verify errors result in indiscriminate subdivision of an erase sector into two groups, followed by further subdivision into further groups, which results in a relatively complicated erase operation. In another example, the excessive use of dummy word lines (WLs) and dummy memory cells in U.S. Pat. No. 7,417,895 is wasteful of potentially usable memory cells.

SUMMARY

Embodiments of the technology address the over-erase issue associated with the floating gate coupling effect of edge WLs. The discussed approaches can even be used without requiring an increased array size. Improved endurance and erase time performance of memory cells result from addressing the over-erase issue in an erase operation.

Various discussed approaches that improve the over erase issue and the coupling effect, include an improved grouping of edge WLs and center WLs of an erase group during erase verify and erase sub-operations of an erase operation. In another approach, changed voltage levels of edge WLs to address the over-erase issue of the erase group, and also improve erase time performance. Another approach uses dummy WLs.

An aspect of the technology is an apparatus including a memory integrated circuit, which includes memory cells, word lines accessing the memory cells, and control circuitry.

The word lines are divided into multiple erase groups. Responsive to an erase command selecting an erase group from the multiple erase groups, control circuitry performs an erase operation on memory cells accessed by word lines in the erase group. Erase groups are commonly called sectors or blocks. The word lines in the erase group include outer word lines (e.g., edge WLs, first and last WL) accessing outer memory cells in the erase group, and inner word lines (e.g., center WLs between first and last WL) accessing inner memory cells in the erase group. The inner memory cells are bounded by the outer memory cells of the erase group, from memory cells accessed by word lines of unselected erase groups of the multiple erase groups.

The control circuitry has the erase operation performed by the control circuitry responsive to the erase command selecting the erase group. The erase operation includes a first erase verify sub-operation performed on the inner word lines in the erase group, prior to a second erase verify sub-operation performed on the outer word lines in the erase group.

In some embodiments, the first erase verify sub-operation of the control circuitry is applied to the inner word lines as a group.

In some embodiments, the second erase verify sub-operation of the control circuitry is applied to the outer word lines as a group.

In some embodiments, erase verify is performed by the control circuitry on the outer word lines as multiple groups, including a first outer group on a first side of the erase group, and a second outer group on a second side of the erase group.

In some embodiments, the erase operation includes an erase sub-operation. Responsive to a failing result from the second erase verify sub-operation of the control circuitry, the erase sub-operation is performed on the outer word lines of the erase group, such that a nonerasing bias arrangement is applied to the inner word lines.

In another embodiment, erase verify is performed by the control circuitry on the outer word lines as multiple groups, including a first outer group on a first side of the erase group, and a second outer group on a second side of the erase group. The erase operation performed by the control circuitry includes the second erase verify sub-operation performed on the first outer group of outer word lines, prior to a third erase verify sub-operation performed on the second outer group of outer word lines. Responsive to a failing result from the second erase verify sub-operation, the erase sub-operation is performed on the first outer group of outer word lines of the erase group, such that a nonerasing bias arrangement is applied to the second outer group of outer word lines.

In another embodiment, erase verify is performed by the control circuitry on the outer word lines as multiple groups, including a first outer group on a first side of the erase group, and a second outer group on a second side of the erase group. The erase operation performed by the control circuitry includes the second erase verify sub-operation performed on the first outer group of outer word lines, prior to a third erase verify sub-operation performed on the second outer group of outer word lines. Responsive to a failing result from the second erase verify sub-operation, the erase sub-operation is performed on the first outer group of outer word lines of the erase group, such that a nonerasing bias arrangement is applied to the second outer group of outer word lines and to the inner word lines.

In another embodiment, erase verify is performed by the control circuitry on the outer word lines as multiple groups, including a first outer group on a first side of the erase group, and a second outer group on a second side of the erase group. The erase operation performed by the control circuitry includes the second erase verify sub-operation performed on the first outer group of outer word lines, prior to a third erase verify sub-operation performed on the second outer group of outer word lines. Responsive to a failing result from the third erase verify sub-operation, the erase sub-operation is performed on the second outer group of outer word lines of the erase group, such that a nonerasing bias arrangement is applied to the third outer group of outer word lines.

In another embodiment, erase verify is performed by the control circuitry on the outer word lines as multiple groups, including a first outer group on a first side of the erase group, and a second outer group on a second side of the erase group. The erase operation performed by the control circuitry includes the second erase verify sub-operation performed on the first outer group of outer word lines, prior to a third erase verify sub-operation performed on the second outer group of outer word lines. Responsive to a failing result from the third erase verify sub-operation, the erase sub-operation is performed on the second outer group of outer word lines of the erase group, such that a nonerasing bias arrangement is applied to the third outer group of outer word lines and to the inner word lines.

An aspect of the technology is a method, including the following steps:

performing on a memory integrated circuit having a plurality of word lines divided into a plurality of erase groups, an erase command selecting an erase group, including:

performing a first erase verify sub-operation on inner word lines in the erase group, prior to performing a second erase verify sub-operation performed on outer word lines in the erase group, wherein the outer word lines access outer memory cells in the erase group, and wherein the inner word lines access inner memory cells in the erase group, such that the inner memory cells are bounded by the outer memory cells of the erase group from memory cells accessed by word lines of unselected erase groups of the plurality of erase groups.

Various other embodiments are discussed herein.

An aspect of the technology is an apparatus including a memory integrated circuit, which includes memory cells, word lines accessing the memory cells, and control circuitry.

The word lines are divided into multiple erase groups. Responsive to an erase command selecting an erase group from the multiple erase groups, control circuitry performs an erase operation on memory cells accessed by word lines in the erase group.

The word lines in the erase group include outer word lines accessing outer memory cells in the erase group, and inner word lines accessing inner memory cells in the erase group. The outer memory cells store data in regular operation of the memory integrated circuit (i.e., not just dummy cells). The inner memory cells are bounded by the outer memory cells of the erase group, from memory cells accessed by word lines of unselected erase groups of the multiple erase groups.

The control circuitry has the erase operation performed by the control circuitry responsive to the erase command selecting the erase group. The erase operation applies a first erase bias arrangement to the inner word lines in the erase group and a second erase bias arrangement to the outer word lines in the erase group. The first erase bias arrangement is different from the second erase bias arrangement.

In some embodiments, the control circuitry applies the first erase bias arrangement including a first word line voltage to at least one of the inner word lines, the control circuitry applies the second erase bias arrangement including a second word line voltage to at least one of the outer word lines, and the first word line voltage is less negative than the second word line voltage.

In some embodiments, the word lines further include dummy word lines, and the outer word lines include a first outer word line adjacent to a dummy word line.

In some embodiments, the word lines further include dummy word lines, and the outer word lines include a first outer word line adjacent to a dummy word line, and a second outer word line adjacent to an unselected word line accessing of an unselected erase group. The control circuitry applies the second erase bias arrangement including a first word line voltage to the first outer word line, and a second word line voltage to the second outer word line, and the first word line voltage is less negative than the second word line voltage.

In some embodiments, the control circuitry applies positive voltage to word lines in unselected erase groups of the plurality of erase groups, and negative voltage to word lines in the erase group selected by the erase command.

An aspect of the technology is a method, including the following steps:

performing on a memory integrated circuit having a plurality of word lines divided into a plurality of erase groups, an erase command selecting an erase group, including:

applying a first erase bias arrangement to inner word lines in the erase group and a second erase bias arrangement to outer word lines in the erase group, the first erase bias arrangement different from the second erase bias arrangement, wherein the outer word lines access outer memory cells in the erase group, and wherein the inner word lines access inner memory cells in the erase group, such that the inner memory cells are bounded by the outer memory cells of the erase group from memory cells accessed by word lines of unselected erase groups of the plurality of erase groups, and the outer memory cells store data in regular operation of the memory integrated circuit.

Various other embodiments are discussed herein.

BRIEF DESCRIPTION OF THE DRAWINGS

FIGS. 2 and 3 illustrate the floating gate coupling effect, by contrasting the different biasing arrangements applied to adjacent word lines, where FIG. 2 shows adjacent word lines receiving the same negative voltage, and FIG. 3 shows adjacent word lines receiving different voltages, including a negative voltage applied to word lines of a selected erase group, and a positive voltage applied to word lines of a de-selected erase group.

FIG. 4 shows equations of the floating gate voltages accounting for capacitive coupling, and applies the equations to show the floating gate coupling effect from the different biasing arrangements of FIGS. 2 and 3.

FIGS. 11 and 12 illustrate the floating gate coupling effect, by contrasting the different biasing arrangements applied to adjacent word lines, where FIG. 11 shows adjacent word lines receiving the same negative voltage applied to center word lines of a selected erase group, and FIG. 12 shows adjacent word lines receiving different voltages, including a positive voltage applied to word lines of a de-selected erase group, a negative voltage applied to an edge word line of a selected erase group, such that the edge word line of the selected erase group receives a more negative voltage than the center word lines of the selected erase group.

FIG. 13 shows equations of the floating gate voltages accounting for capacitive coupling, and applies the equations to show how the different erase bias arrangements applied to the group of center word lines and the groups of edge word lines, addresses the floating gate coupling effect, as shown in FIGS. 11 and 12.

DETAILED DESCRIPTION

Figure 1:
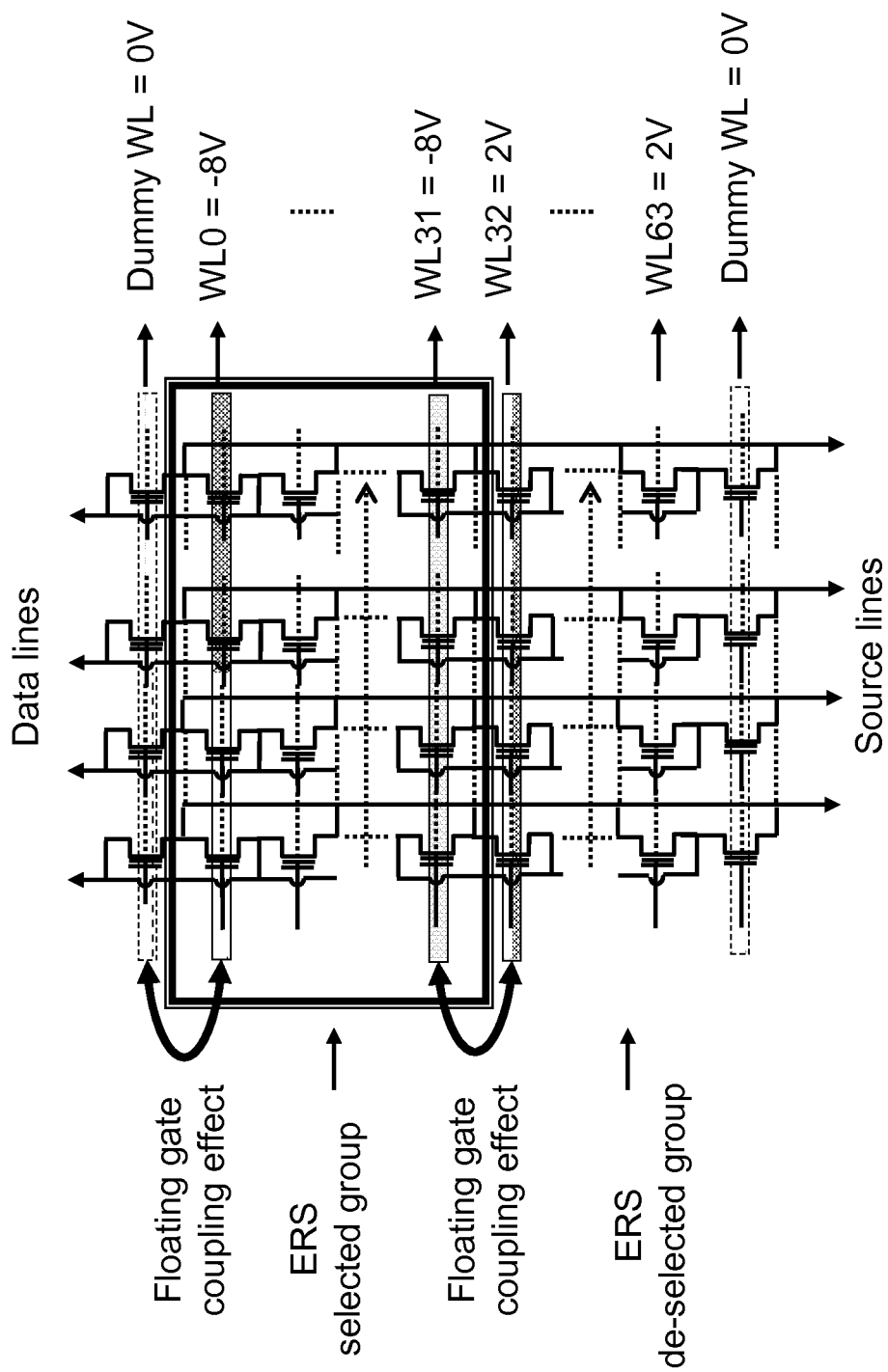
FIG. 1 is a block diagram of a memory array portion with multiple erase groups, showing the floating gate coupling effect between adjacent erase groups.

FIG. 1 is a block diagram of a memory array portion with multiple erase groups, showing the floating gate coupling effect between adjacent erase groups. Common examples of an erase group are erase sectors and erase blocks that include word lines which access memory cells erased together, responsive to an erase command identifying a particular erase sector or erase block to be erased.

In particular, FIG. 1 shows that neighboring memory cells have a coupling effect when the neighboring memory cells are accessed by WLs having different voltage levels. Accordingly, the edge WLs of an erase group have a floating gate coupling effect during an erase operation. The effect will impact Vt uniformity after erase operation from dummy WL, or edge WL of an adjacent erase group.

FIGS. 2 and 3 illustrate the floating gate coupling effect, by contrasting the different biasing arrangements applied to adjacent word lines, where FIG. 2 shows adjacent word lines receiving the same negative voltage, and FIG. 3 shows adjacent word lines receiving different voltages, including a negative voltage applied to word lines of a selected erase group, and a positive voltage applied to word lines of a de-selected erase group. In FIGS. 2 and 3, $V_{FG}$ is the floating gate voltage of a cell, and CFF is the cell to cell parasitic capacitance.

FIG. 4 shows equations of the floating gate voltages accounting for capacitive coupling, and applies the equations to show the floating gate coupling effect from the different biasing arrangements of FIGS. 2 and 3.

The various α values represent coupling to the floating gate from a neighboring node. In particular, α1 is the coupling value for CFW (word line), α2 is the coupling value for CFF (neighboring floating gate), α3 is the coupling value for CFB (body) and α4 is the coupling value for CFD (drain). Q refers to the charge stored on the respective floating gates, and CT is the nominal capacitance of the floating gate. When the voltage of WL1 is equal to the voltage of WL31, and the voltages of WL2 and WL32 are the same too, then $C_{FG}$ (coupling capacitance value, $Q_T = C_{FG} * V_{FG}$) will be unchanged, when the voltage $V_{FG}$ 1 is largely equal to the voltage $V_{FG}$ 31. But the voltage of WL32 is greater than the voltage of WL2, so the voltage $V_{FG}$ 1 is smaller than the voltage $V_{FG}$ 31.

Figure 5:
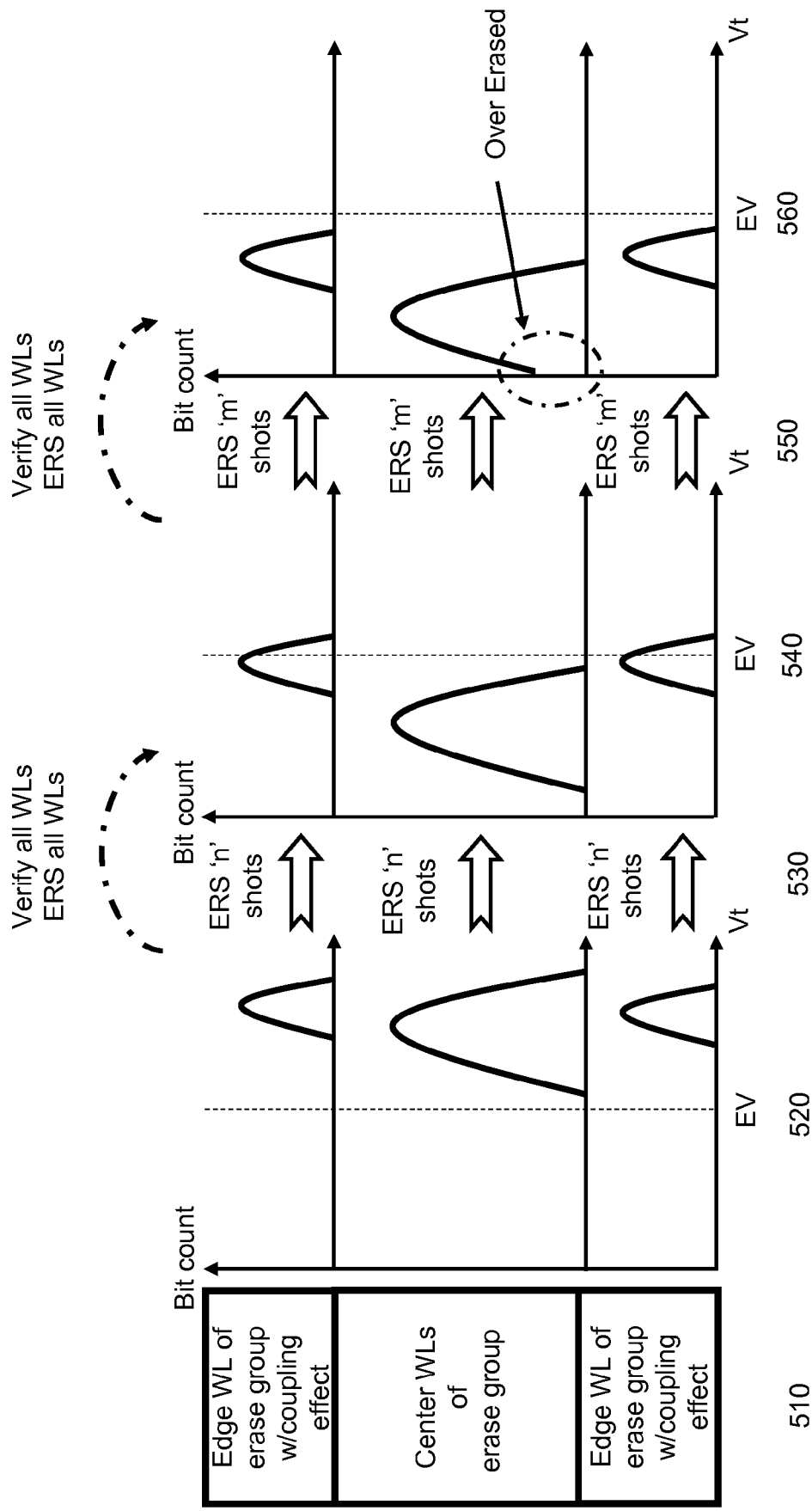
FIG. 5 shows multiple steps of an erase operation multiple sub-operations of erase and erase verify, to show that relying on an erase verify sub-operation on an edge word line of the erase group, to perform an erase sub-operation on all word lines of the erase group, results in over-erasing of center word lines in the erase group.

FIG. 5 shows multiple steps of an erase operation multiple sub-operations of erase and erase verify, to show that relying on an erase verify sub-operation on an edge word line of the erase group, to perform an erase sub-operation on all word lines of the erase group, results in over-erasing of center word lines in the erase group.

In 510, the WLs of an erase group are shown as the center WLs of an erase group, between edge WLs of the erase group. In 520, the threshold voltage distributions are shown for the center and edge WLs. In 530, 'n' erase shots are performed on all WLs. In the threshold voltage distributions shown for the center and edge WLs 540, the center WLs of an erase pass erase verify, but edge WLs fail erase verify, due to the floating gate coupling effect. In 550, 'm' erase shots are performed on all WLs. In the threshold voltage distributions shown for the center and edge WLs 560, although the edge WLs have passed erase verify, the center WL region has over-erased. Accordingly, the floating gate coupling effect caused the Vt distribution to over-erase in the center WL region.

Figure 6:
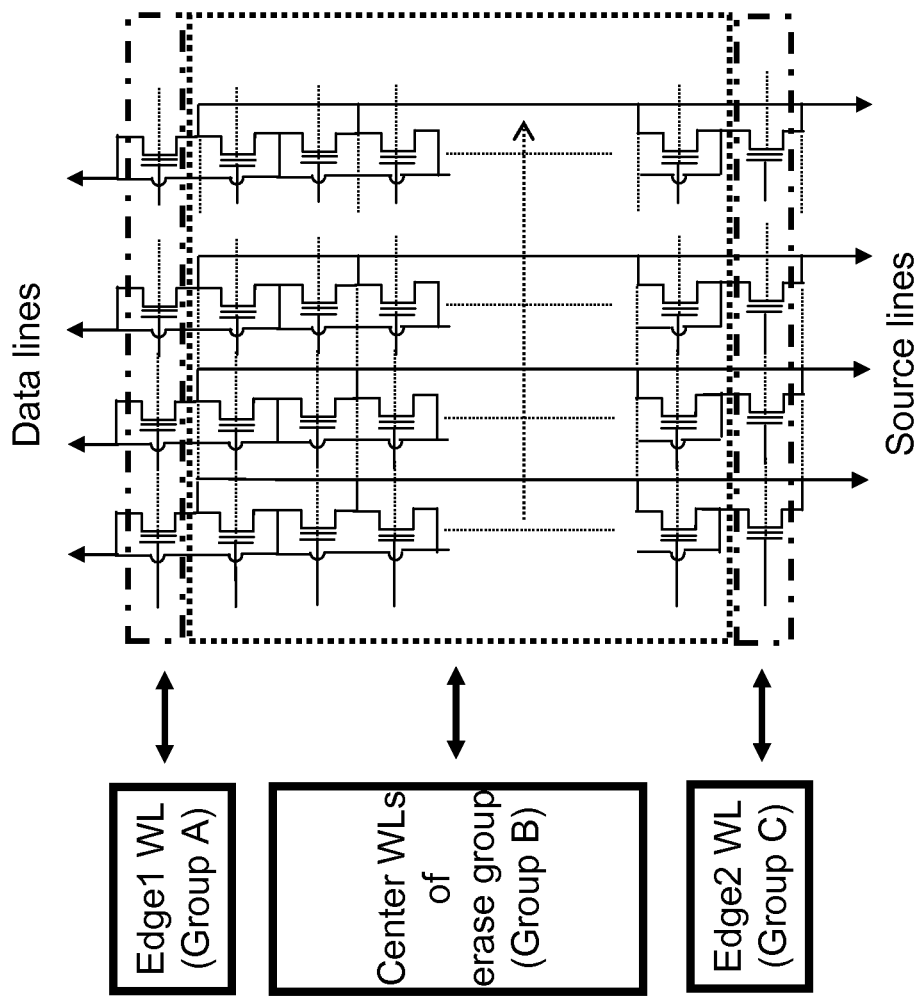
FIG. 6 is a block diagram of a memory array portion which divides word lines of an erase group into multiple groups, including groups of edge word lines, and a group of center word lines between the groups of edge word lines, such that the edge word lines bound the center word lines from word lines of other erase groups.

FIG. 6 is a block diagram of a memory array portion which divides word lines of an erase group into multiple groups, including groups of edge word lines, and a group of center word lines between the groups of edge word lines, such that the edge word lines bound the center word lines from word lines of other erase groups.

FIG. 6 shows grouping of the edge WLs in the erase operation into A and C groups, and the middle WLs into the B group. These groups are verified separately in the erase operation.

Figure 7:
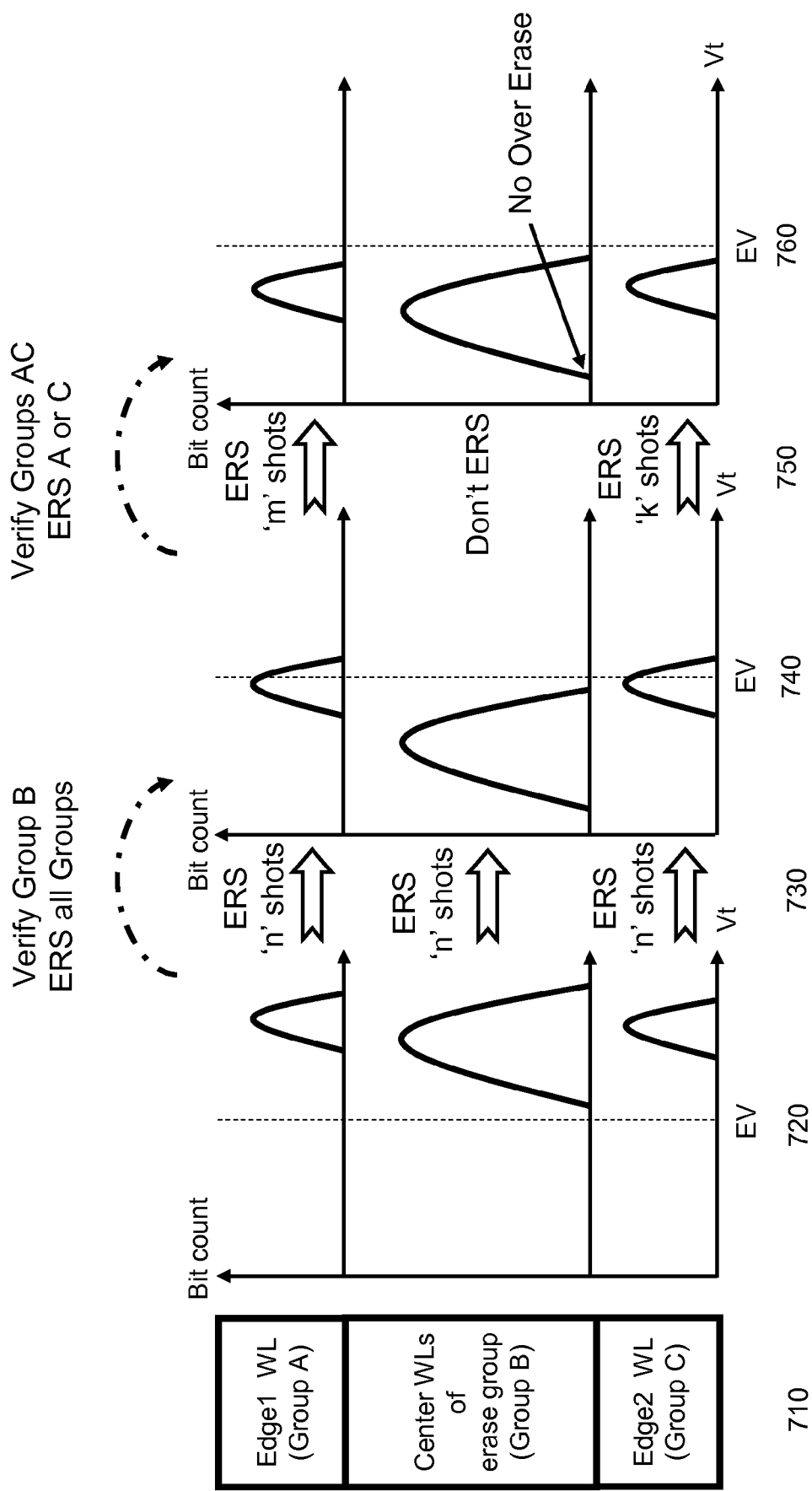
FIG. 7 shows multiple steps of an erase operation with multiple sub-operations of erase and erase verify, to show that relying on an erase verify sub-operation on the group of center word lines of the erase group, to perform an erase sub-operation on all word lines of the erase group, followed by relying on an erase verify sub-operation on the group(s) of edge word lines of the erase group, to perform an erase sub-operation on the group(s) of edge word lines of the erase group, results in no over-erasing of center word lines in the erase group.

FIG. 7 shows multiple steps of an erase operation with multiple sub-operations of erase and erase verify, to show that relying on an erase verify sub-operation on the group of center word lines of the erase group, to perform an erase sub-operation on all word lines of the erase group, followed by relying on an erase verify sub-operation on the group(s) of edge word lines of the erase group, to perform an erase sub-operation on the group(s) of edge word lines of the erase group, results in no over-erasing of center word lines in the erase group.

In 710, the WLs of an erase group are shown as the center WLs of an erase group, between edge WLs of the erase group. In 720, the threshold voltage distributions are shown for the center and edge WLs. In 730, 'n' erase shots are performed on all WLs, but only the center WLs are erase verified. In the threshold voltage distributions shown for the center and edge WLs 740, the center WLs of an erase pass erase verify. Edge WLs would fail erase verify, due to the floating gate coupling effect, but erase verify is not performed on edge WLs yet. In 750, 'm' erase shots are performed on edge WLs. In the threshold voltage distributions shown for the center and edge WLs 760, the edge WLs have passed erase verify. The center WL region has not over-erased. Accordingly, the floating gate coupling effect did not cause the Vt distribution to over-erase in the center WL region.

Stated differently, in erase verify, is performed on the center WL group B, and upon failure, all groups are erased. When the center WL group passes erase verify, then next, erase verify and erase are performed on edge WL groups A and C.

Figure 8:
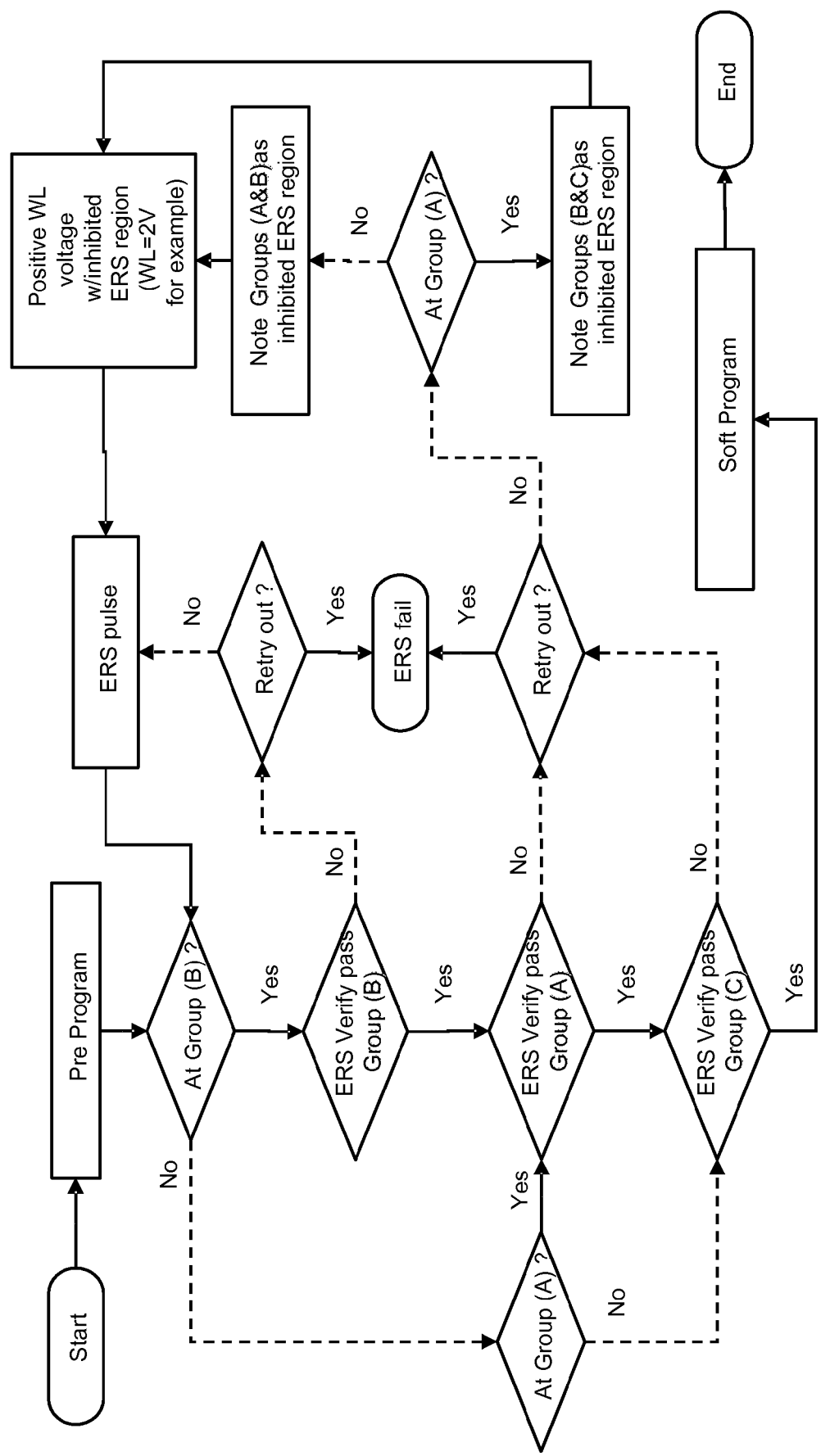
FIG. 8 shows a flowchart for performing an erase operation, divided into numerous sub-operations, such that the multiple groups of edge word lines are treated separately.

FIG. 8 shows a flowchart for performing an erase operation, divided into numerous sub-operations, such that the multiple groups of edge word lines are treated separately.

In the flowchart, the edge WLs groups A and C are erase verified and erased separately. After pre-program, first group B has been erase verified. If the erase verify fails, then all groups are erased. When group B passes erase verify, then group A is erase verified. If erase verify fails, only group A is erased; then groups B and C are noted as inhibited erase regions, such that during the erase sub-operation the inhibited WL level equal to 2V is applied to inhibited erase regions (even in the selected erase group). When group A passes erase verify, group C is erase verified. If erase verify fails, only group C is erased; then groups A and B are noted as inhibited erase regions, such that during the erase sub-operation the inhibited WL level equal to 2V is applied to inhibited erase regions (even in the selected erase group). Finally soft program ends the erase operation.

Figure 9:
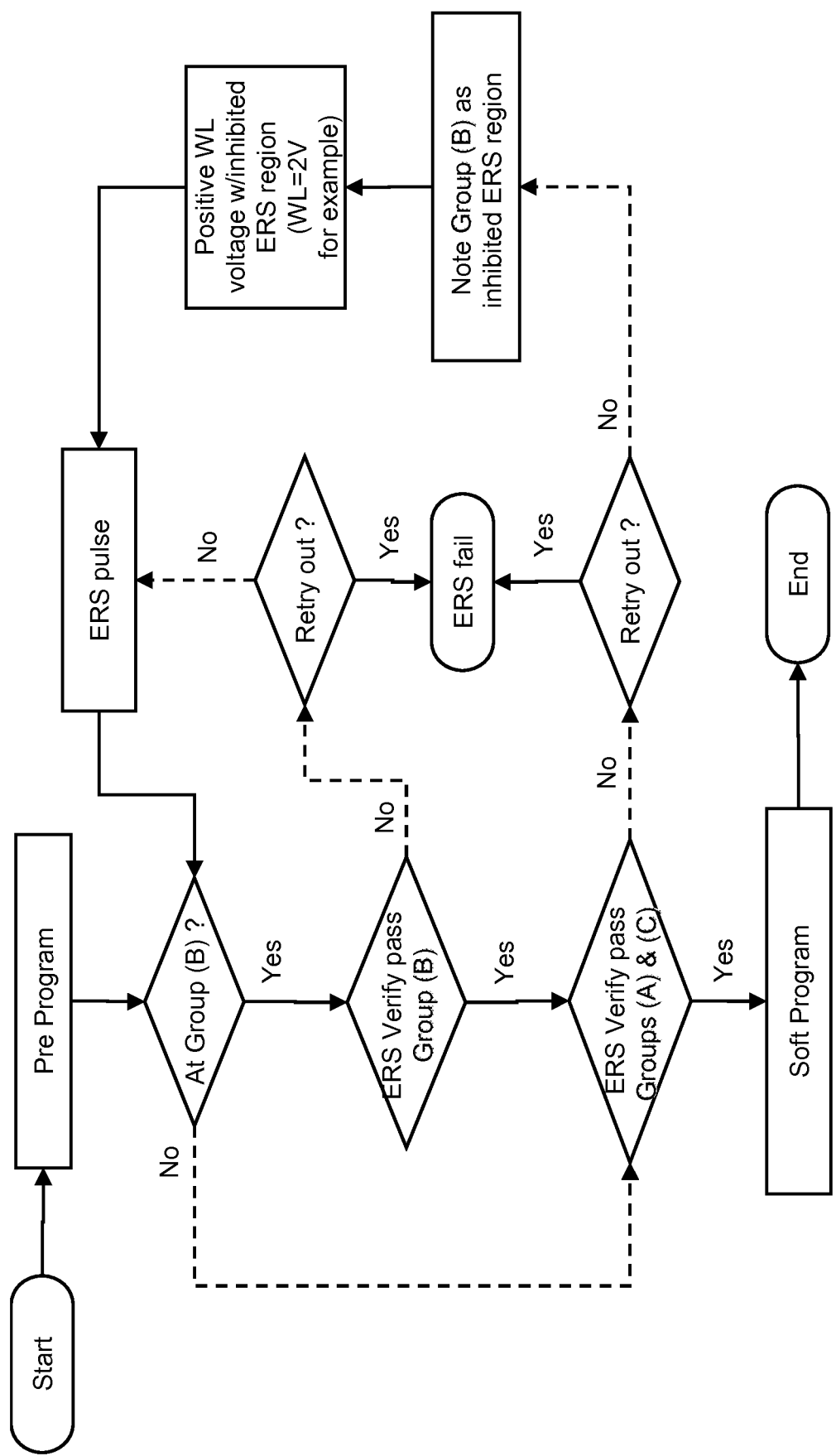
FIG. 9 shows a flowchart for performing an erase operation, divided into numerous sub-operations, such that the multiple groups of edge word lines are treated together.

FIG. 9 shows a flowchart for performing an erase operation, divided into numerous sub-operations, such that the multiple groups of edge word lines are treated together.

In this flowchart, the edge WL groups are merged. Although similar to the flowchart of FIG. 8, the edge WL groups A and C are erase verified at the same time. After group B passes erase verify, only group B is noted as an inhibited erase region.

Figure 10:
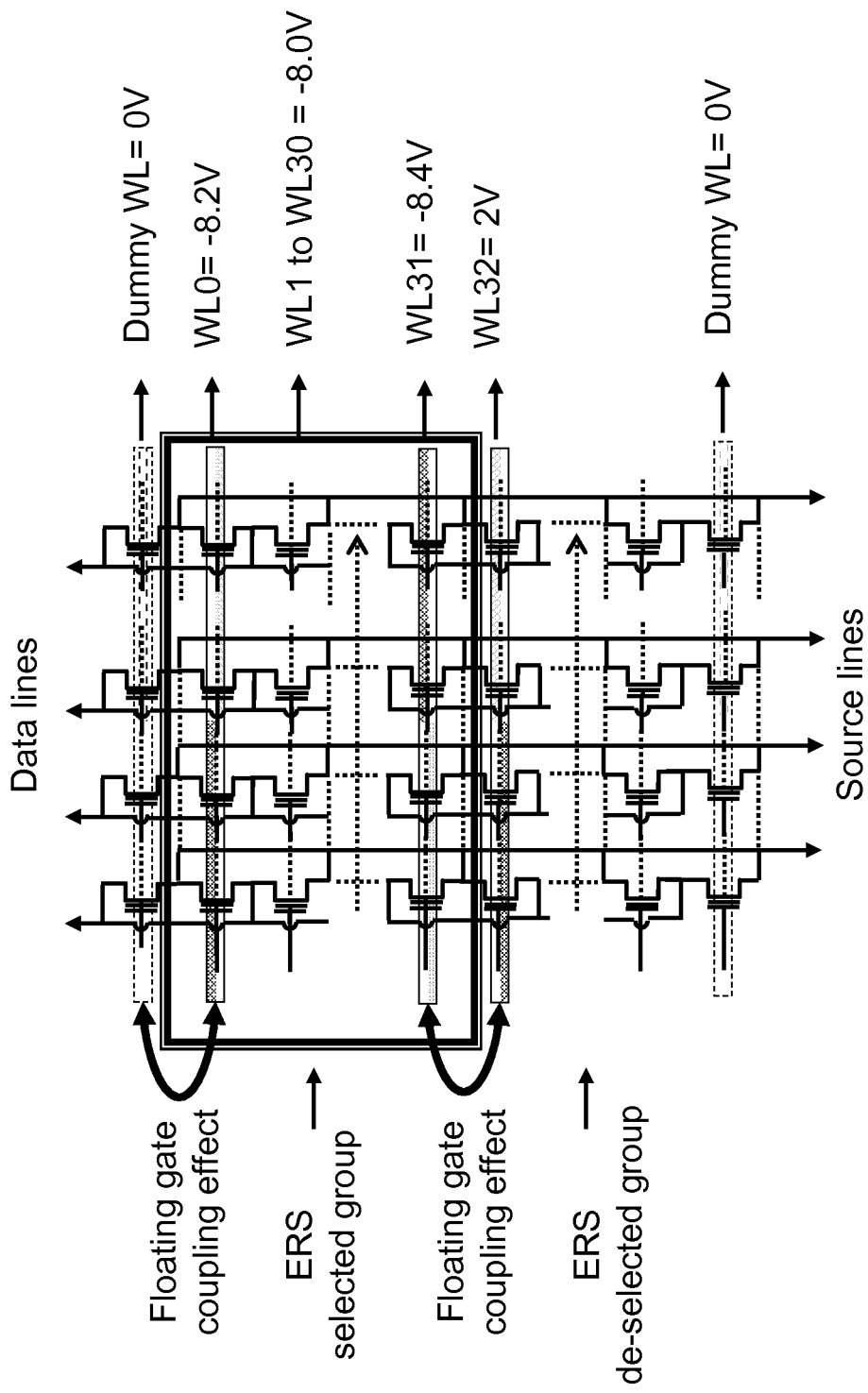
FIG. 10 is a block diagram of a memory array portion with multiple erase groups, showing the floating gate coupling effect between adjacent erase groups, and which divides word lines of an erase group into multiple groups, including groups of edge word lines, and a group of center word lines between the groups of edge word lines, such that the edge word lines bound the center word lines from word lines of other erase groups, and which addresses the floating gate coupling effect, by applying different erase bias arrangements to the group of center word lines and the groups of edge word lines.

FIG. 10 is a block diagram of a memory array portion with multiple erase groups, showing the floating gate coupling effect between adjacent erase groups, and which divides word lines of an erase group into multiple groups, including groups of edge word lines, and a group of center word lines between the groups of edge word lines, such that the edge word lines bound the center word lines from word lines of other erase groups, and which addresses the floating gate coupling effect, by applying different erase bias arrangements to the group of center word lines and the groups of edge word lines.

Because of the floating gate coupling effect in the edge WLs of an erase group, the $|V_{FG}|$ drop decreases. So the negative voltage magnitude of edge WLs are increased to compensate for the $V_{FG}$ variation among neighboring WLs.

FIGS. 11 and 12 illustrate the floating gate coupling effect, by contrasting the different biasing arrangements applied to adjacent word lines, where FIG. 11 shows adjacent word lines receiving the same negative voltage applied to center word lines of a selected erase group, and FIG. 12 shows adjacent word lines receiving different voltages, including a positive voltage applied to word lines of a de-selected erase group, a negative voltage applied to an edge word line of a selected erase group, such that the edge word line of the selected erase group receives a more negative voltage than the center word lines of the selected erase group.

FIG. 13 shows equations of the floating gate voltages accounting for capacitive coupling, and applies the equations to show how the different erase bias arrangements applied to the group of center word lines and the groups of edge word lines, addresses the floating gate coupling effect, as shown in FIGS. 11 and 12.

The $V_{FG}$ 31 is coupled to edge WL32. After changing the WL31 voltage level to compensate for the $V_{FG}$ coupling effect, the value of $(\alpha_1 * V_{WL1} + \alpha_1 \alpha_2 * V_{WL2})$ will equal the value of $(\alpha_1 * V_{WL31} + \alpha_1 \alpha_2 * V_{WL32})$. So $V_{FG}$ 1 will equal $V_{FG}$ 31. Therefore the changed voltage level of an edge WL counteracts the floating gate coupling effect in an erase operation.

Figure 14:
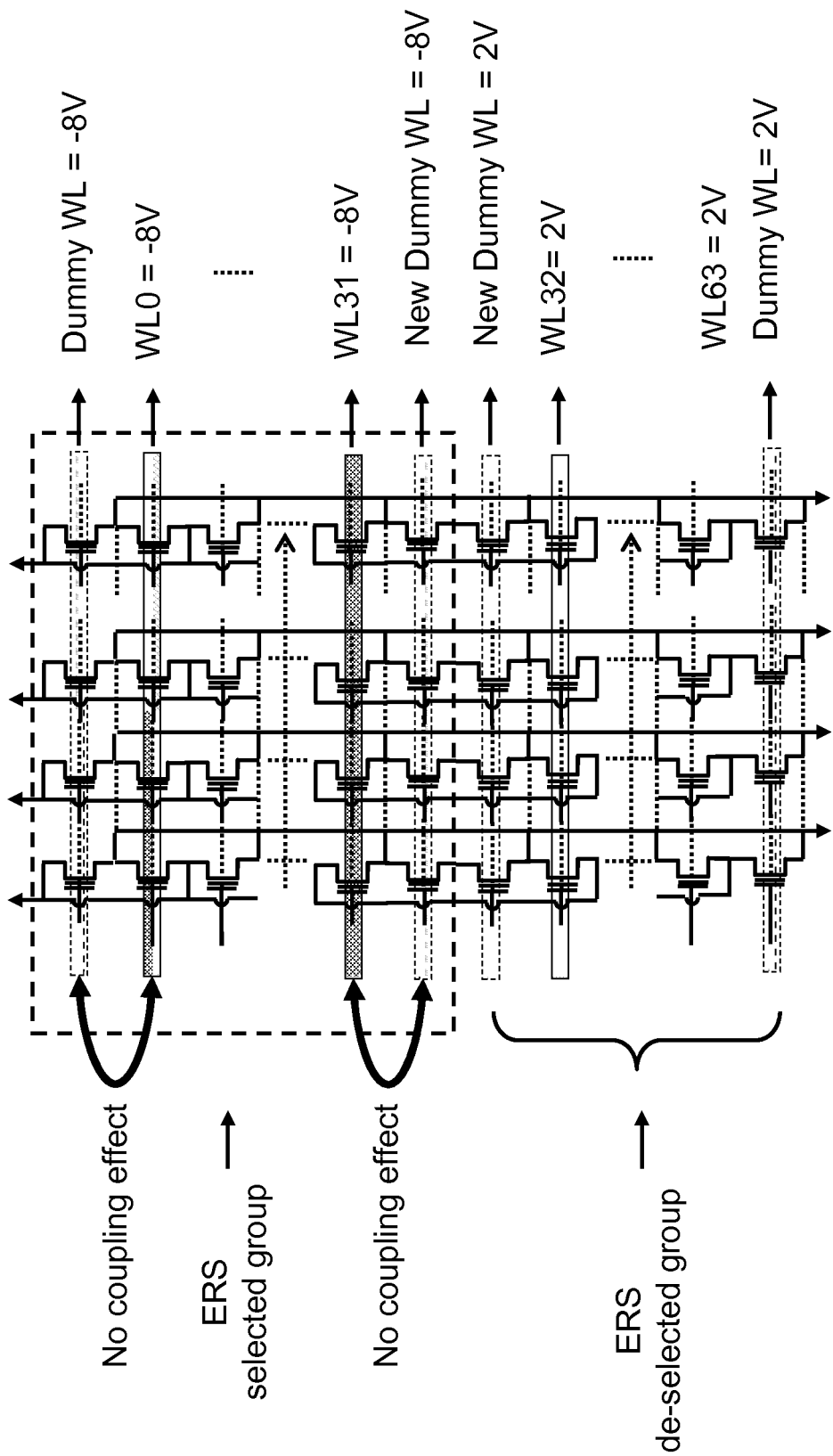
FIG. 14 is a block diagram of a memory array portion with multiple erase groups, which addresses the floating gate coupling effect, by including dummy word lines between different erase groups.

FIG. 14 is a block diagram of a memory array portion with multiple erase groups, which addresses the floating gate coupling effect, by including dummy word lines between different erase groups.

Dummy WLs eliminate the coupling effect. The dummy WL voltage level is the same as an edge WL voltage level in the erase operation, so the edge WLs do not suffer from the coupling effect.

Figure 15:
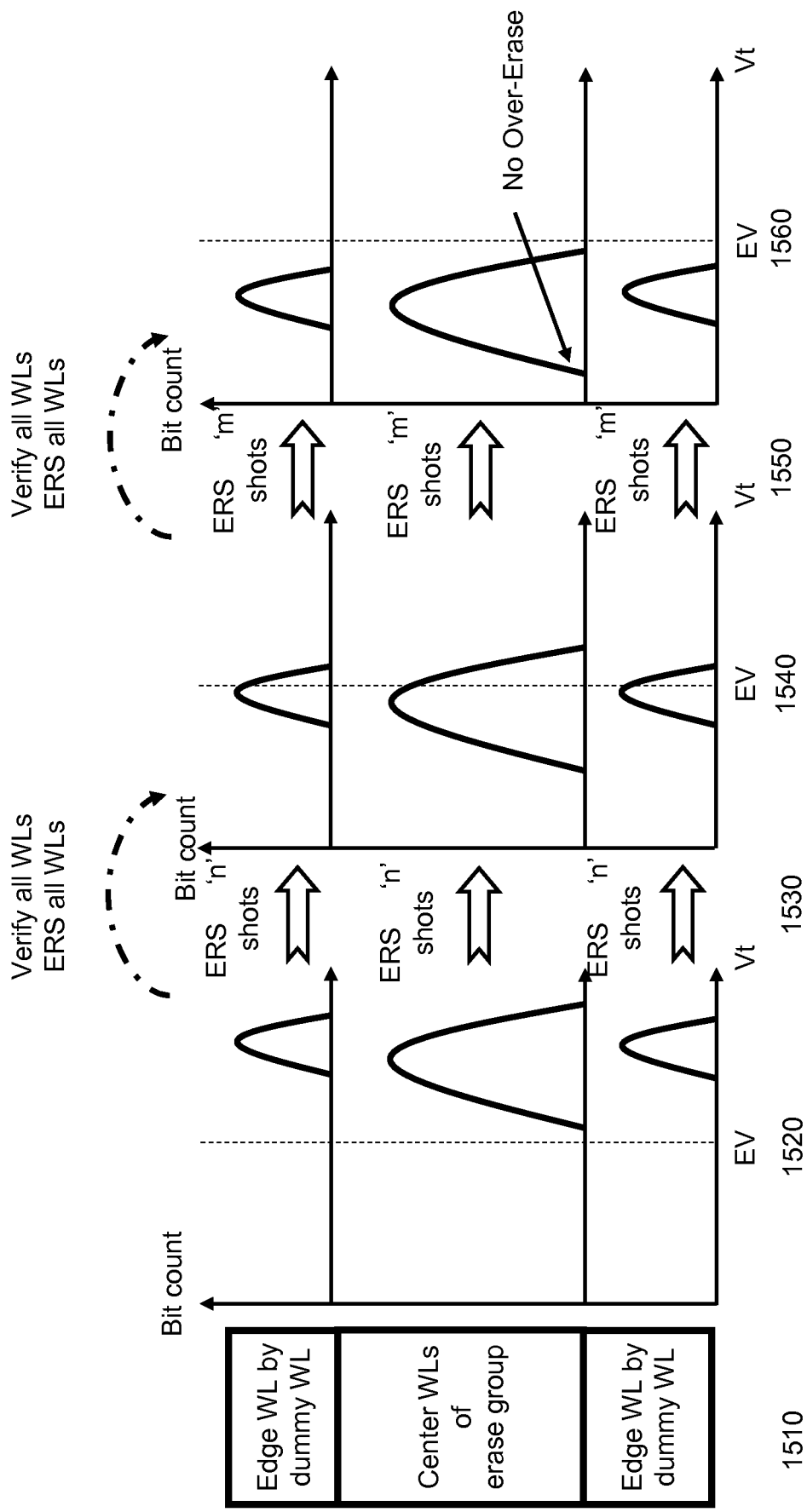
FIG. 15 shows multiple steps of an erase operation multiple sub-operations of erase and erase verify, to show that inclusion of dummy world lines between different erase groups, results in no over-erasing of center word lines in the erase group.

FIG. 15 shows multiple steps of an erase operation multiple sub-operations of erase and erase verify, to show that inclusion of dummy world lines between different erase groups, results in no over-erasing of center word lines in the erase group.

In 1510, the WLs of an erase group are shown as the center WLs of an erase group, between edge WLs of the erase group. In 1520, the threshold voltage distributions are shown for the center and edge WLs. In 1530, 'n' erase shots are performed on all WLs. In the threshold voltage distributions shown for the center and edge WLs 1540, all WLs have failed verify and have about the same Vt level due to no floating gate effect. In 1550, 'm' erase shots are performed on all WLs. In the threshold voltage distributions shown for the center and edge WLs 1560, although the edge WLs have passed erase verify, and the center region has not over-erased. Accordingly, the Vt distribution has not over-erased.

No over-erase resulted in the Vt distribution, due to the changed edge WLs voltage level and the dummy WLs. Because the floating gate coupling effect is eliminated from the edge WLs, all WLs can be verified and erased, removing the over-erase effect.

Figure 16:
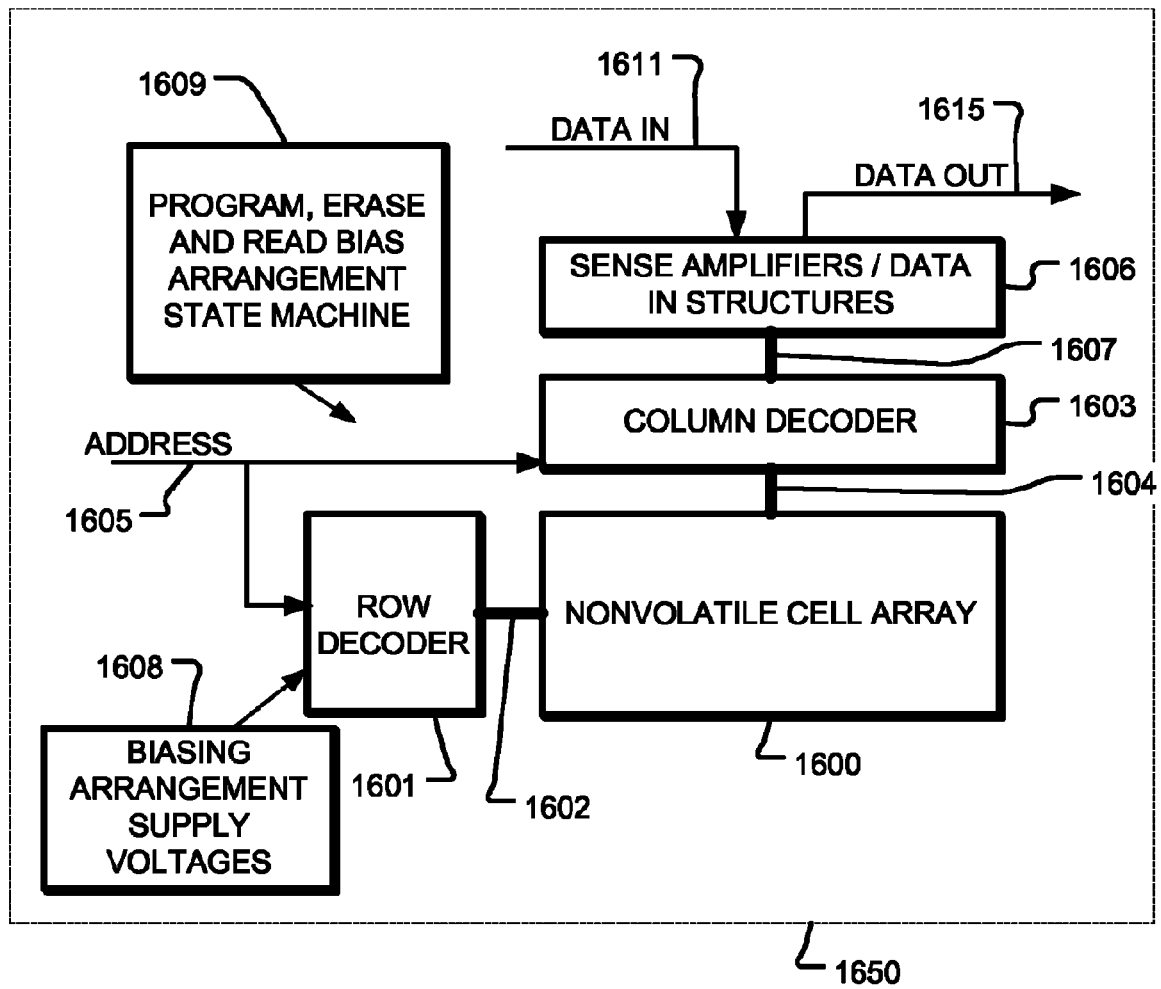
FIG. 16 is a simplified block diagram of an integrated circuit including a memory array implemented using any of the erase operation improvements as described herein.

FIG. 16 is a simplified block diagram of an integrated circuit including a memory array implemented using any of the erase operation improvements as described herein.

FIG. 16 is a simplified block diagram of an integrated circuit 1660 including a memory array 1600. A word line (or row) and block select decoder 1601 is coupled to, and in electrical communication with, a plurality 1602 of word lines and string select lines, and arranged along rows in the memory array 1600. A bit line (column) decoder and drivers 1603 are coupled to and in electrical communication with a plurality of bit lines 1604 arranged along columns in the memory array 1600 for reading data from, and writing data to, the memory cells in the memory array 1600. Addresses are supplied on bus 1605 to the word line decoder and drivers 1601 and to the bit line decoder 1603. Sense amplifiers and data-in structures in block 1606, including current sources for the read, program and erase modes, are coupled to the bit line decoder 1603 via the bus 1607. Data is supplied via the data-in line 1611 from input/output ports on the integrated circuit 1650, to the data-in structures in block 1606. Data is supplied via the data-out line 1615 from the sense amplifiers in block 1606 to input/output ports on the integrated circuit 1650, or to other data destinations internal or external to the integrated circuit 1650. State machine and improved clock circuitry are in circuitry 1609, controlling biasing arrangement supply voltages 1608.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An operating method of a memory having a plurality of word lines divided into a plurality of erase groups including inner word lines and outer word lines, comprising:
applying a first word line voltage to at least one of the inner word lines in a selected erase group; and
applying a second word line voltage to at least one of the outer word lines in the selected erase group, the first word line voltage being less negative than the second word line voltage, wherein the outer word lines access outer memory cells in the selected erase group and the inner word lines access inner memory cells in the selected erase group, such that the inner memory cells are bounded by the outer memory cells of the selected erase group from memory cells accessed by word lines of unselected erase groups of the plurality of erase groups, and at least one of the outer word lines accessing memory cells storing data in regular operation of the memory.

2. The method of claim 1, wherein a third word line voltage applied to at least one of the inner word lines in the selected erase group, and a fourth word line voltage applied to at least one of the outer word lines in the selected erase group, are applied as sub-operations of an erase verify operation, the third word line voltage applied in a first erase verify sub-operation, and the fourth word line voltage is applied in a second erase verify sub-operation.

3. The method of claim 2, wherein the first erase verify sub-operation is applied to the inner word lines as a group.

4. The method of claim 2, wherein the second erase verify sub-operation is applied to the outer word lines as a group.

5. The method of claim 1, wherein erase verify is performed on the outer word lines as multiple groups, including a first outer group on a first side of the erase group, and a second outer group on a second side of the erase group.

6. The method of claim 2, wherein an erase operation includes an erase sub-operation, and
wherein, responsive to a failing result from the second erase verify sub-operation, the erase sub-operation is performed on the outer word lines of the erase group, such that a nonerasing bias arrangement is applied to the inner word lines.

7. The method of claim 2, wherein an erase operation includes an erase sub-operation,
wherein erase verify is performed on the outer word lines as multiple groups, including a first outer group on a first side of the erase group, and a second outer group on a second side of the erase group,
wherein the erase operation includes the second erase verify sub-operation performed on the first outer group of outer word lines, prior to a third erase verify sub-operation performed on the second outer group of outer word lines, and
wherein, responsive to a failing result from the second erase verify sub-operation, the erase sub-operation is performed on the first outer group of outer word lines of the erase group, such that a nonerasing bias arrangement is applied to the second outer group of outer word lines.

8. The method of claim 2, wherein an erase operation includes an erase sub-operation,
wherein erase verify is performed on the outer word lines as multiple groups, including a first outer group on a first side of the erase group, and a second outer group on a second side of the erase group,
wherein the erase operation includes the second erase verify sub-operation performed on the first outer group of outer word lines, prior to a third erase verify sub-operation performed on the second outer group of outer word lines, and
wherein, responsive to a failing result from the second erase verify sub-operation, the erase sub-operation is performed on the first outer group of outer word lines of the erase group, such that a nonerasing bias arrangement is applied to the second outer group of outer word lines and to the inner word lines.

9. The method of claim 2, wherein an erase operation includes an erase sub-operation,
wherein erase verify is performed on the outer word lines as multiple groups, including a first outer group on a first side of the erase group, and a second outer group on a second side of the erase group,
wherein the erase operation includes the second erase verify sub-operation performed on the first outer group of outer word lines, prior to a third erase verify sub-operation performed on the second outer group of outer word lines, and
wherein, responsive to a failing result from the third erase verify sub-operation, the erase sub-operation is performed on the second outer group of outer word lines of the erase group, such that a nonerasing bias arrangement is applied to a third outer group of outer word lines.

10. The method of claim 2, wherein an erase operation includes an erase sub-operation,
wherein erase verify is performed on the outer word lines as multiple groups, including a first outer group on a first side of the erase group, and a second outer group on a second side of the erase group,
wherein the erase operation includes the second erase verify sub-operation performed on the first outer group of outer word lines, prior to a third erase verify sub-operation performed on the second outer group of outer word lines, and
wherein, responsive to a failing result from the third erase verify sub-operation, the erase sub-operation is performed on the second outer group of outer word lines of the erase group, such that a nonerasing bias arrangement is applied to a third outer group of outer word lines and to the inner word lines.

11. A memory apparatus, comprising:
a plurality of memory cells;
a plurality of word lines accessing the plurality of memory cells, the plurality of word lines divided into a plurality of erase groups, an erase group from the plurality of erase groups selected by control circuitry responsive to an erase command, the word lines in the selected erase group including:
outer word lines accessing outer memory cells in the selected erase group; and
inner word lines accessing inner memory cells in the selected erase group, the inner memory cells bounded by the outer memory cells of the selected erase group from memory cells accessed by word lines of unselected erase groups of the plurality of erase groups,
wherein at least one of the outer word lines is adjacent to at least one of the word lines of the unselected erase groups, said at least one of the outer word lines accessing memory cells storing data in regular operation of the memory apparatus; and the control circuitry performing an erase operation on memory cells accessed by word lines in the selected erase group, wherein the erase operation applies a first word line voltage to at least one of the inner word lines in the selected erase group, and applies a second word line voltage to at least one of the outer word lines in the selected erase group, wherein the first word line voltage is less negative than the second word line voltage.

12. The memory apparatus of claim 11, wherein a third word line voltage and a fourth word line voltage are applied as sub-operations of an erase verify operation, the third word line voltage is applied in a first erase verify sub-operation, and the fourth word line voltage is applied in a second erase verify sub-operation.

13. The memory apparatus of claim 12, wherein an erase operation includes an erase sub-operation, and wherein, responsive to a failing result from the second erase verify sub-operation of the control circuitry, the erase sub-operation is performed on the outer word lines of the erase group, such that a nonerasing bias arrangement is applied to the inner word lines.

14. The memory apparatus of claim 12, wherein an erase operation includes an erase sub-operation, wherein erase verify is performed by the control circuitry on the outer word lines as multiple groups, including a first outer group on a first side of the erase group, and a second outer group on a second side of the erase group, wherein the erase operation performed by the control circuitry includes the second erase verify sub-operation performed on the first outer group of outer word lines, prior to a third erase verify sub-operation performed on the second outer group of outer word lines, and wherein, responsive to a failing result from the second erase verify sub-operation, the erase sub-operation is performed on the first outer group of outer word lines of the erase group, such that a nonerasing bias arrangement is applied to the second outer group of outer word lines and to the inner word lines.

15. The memory apparatus of claim 11, wherein the plurality of word lines further includes a plurality of dummy word lines, and wherein the outer word lines include a first outer word line adjacent to a dummy word line.

16. The memory apparatus of claim 12, wherein the plurality of word lines further includes a plurality of dummy word lines, and wherein the outer word lines include a first outer word line adjacent to a dummy word line, and a second outer word line adjacent to an unselected word line accessing an unselected erase group.

* * * * *